(12) United States Patent
Miyamoto

(10) Patent No.: US 6,799,310 B2
(45) Date of Patent: Sep. 28, 2004

(54) INTEGRATED CIRCUIT LAYOUT METHOD AND PROGRAM FOR MITIGATING EFFECT DUE TO VOLTAGE DROP OF POWER SUPPLY WIRING

(75) Inventor: Tetsuo Miyamoto, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 101 days.

(21) Appl. No.: 10/325,964

(22) Filed: Dec. 23, 2002

(65) Prior Publication Data

US 2003/0177461 A1 Sep. 18, 2003

(30) Foreign Application Priority Data

Mar. 13, 2002 (JP) ........................................ 2002-067786

(51) Int. Cl.$^7$ .............................................. G06F 17/50
(52) U.S. Cl. ................................ 716/10; 716/8; 716/11
(58) Field of Search ............................ 716/10, 8, 9, 11

(56) References Cited

U.S. PATENT DOCUMENTS 5,774,367 A * 6/1998 Reyes et al. .................... 716/2

FOREIGN PATENT DOCUMENTS

| JP | 5-108757 | 4/1993 |
|---|---|---|
| JP | 5-216961 | 8/1993 |
| JP | 2000-99554 | 4/2000 |

OTHER PUBLICATIONS

Hsieh et al., "Size Optimization for CMOS Basic Cell of VLSI", June 1991, IEEE International Symposium on Circuits and Systems, vol. 4, pp. 2180 –2183.*

Yamada et al., "Synergistic Power/Area Optimization with Transistor Sizing and Wire Length Minimization", Oct. 1994, Digest o Technical Papers, IEEE Symposium, Low Power ELectronics, pp. 50 –51.*

* cited by examiner

Primary Examiner—Vuthe Siek
Assistant Examiner—Sun James Lin
(74) Attorney, Agent, or Firm—Staas & Halsey LLP

(57) ABSTRACT

An integrated circuit layout method for placing a plurality of cells within a chip comprises a process for sorting the plurality of cells (or function macros) that are to be laid out in order of their delay times (or operation speed margins for macro), placing cells (or macros) having the largest delay times (or smallest speed margin for macro) closer to the peripheral area of the chip, and as the cell delay times get smaller(or the speed margins get larger), placing the relevant cells (or macros) closer to the central area of the chip.

11 Claims, 13 Drawing Sheets

FIG. 4

CELL LIBRARY

| CELL | DELAY TIME | LAYOUT DATA |
|---|---|---|
| NAND1 | td1 | LD1 |
| NAND2 | td2 | LD2 |
| NOR1 | td3 | LD3 |
| NOR2 | td4 | LD4 |
| FF1 | td5 | LD5 |
| FF2 | td6 | LD6 |
| INV1 | td7 | LD7 |
| INV2 | td8 | LD8 |

FIG. 5

MACRO LIBRARY

| MACRO | MAXIMUM OPERABLE CLOCK FREQUENCY | LAYOUT DATA |
|---|---|---|
| MACRO1 | F1 | MLD1 |
| MACRO2 | F2 | MLD2 |
| MACRO3 | F3 | MLD3 |
| MACRO4 | F4 | MLD4 |
| MACRO5 | F5 | MLD5 |
| MACRO6 | F6 | MLD6 |
| MACRO7 | F7 | MLD7 |
| MACRO8 | F8 | MLD8 |

INTEGRATED CIRCUIT LAYOUT METHOD AND PROGRAM FOR MITIGATING EFFECT DUE TO VOLTAGE DROP OF POWER SUPPLY WIRING

BACKGROUND OF THE INVENTION

1. Field of the Invention

The present invention relates to an integrated circuit layout method and program, particularly to an integrated circuit layout method and program that mitigates the effect due to a voltage drop of the power supply wiring.

2. Description of the Related Art

Conventional ASIC design can eliminate a voltage drop due to power supply wiring by making the power supply wiring width and film thickness sufficiently large so as to supply a uniform power supply voltage across the entire chip. Therefore, during the on-chip layout process, precedence is mainly given to inter-cell or inter-function macro connections so that the connection wiring area or the critical path length can be minimized, when performing on-cell layout (floorplanning) of cells or function macros.

FIG. 1 is a plane view showing an example of on-chip power supply wiring. Power supply ring 14 connected to and circumnavigated past a plurality of power supply pins 12, is provided at on the periphery of chip 10, and a plurality of internal power supply wires 15 are also established in a lattice shape. By using this kind of power supply wiring configuration, the power supply voltage supplied from an external source to power supply pins 12 is supplied uniformly within the chip via power supply ring 14 and internal power supply wires 15. The ground-side power supply wiring also has a similar configuration, and a uniform supply voltage and ground voltage are supplied within the chip.

In recent years, to increase the scale of integration and speed of integrated circuits, the transistors and wiring have been made increasingly minute. Accompanying this decrease in size, there is also a tendency for the on-chip power supply wiring to become minuter. In the future, it is expected that as the cross section of the power supply wiring decreases, the voltage drop due to the resistance of the power supply wiring will become impossible to ignore.

FIG. 2 shows a power supply voltage distribution that is expected in the future. Although external power supply ring 14 is shown in FIG. 2, internal power supply wires 15 have been omitted. The interior of power supply ring 14 is integrated circuit layout area 20. The power supply voltage supplied to power supply pins 12, which are established at the periphery of the chip, is distributed to layout area 20 via power supply ring 14 and internal power supply wires 15. However, as the wiring becomes minuter in the future, the resistance of internal power supply wires 15 and other wiring will grow large enough that it cannot be ignored, and the power supply voltage drop will increase.

As shown in FIG. 2, power supply voltage Vcc1 at the four corners of layout area 20, power supply voltage Vcc2 at the centers of the four sides, and power supply voltage Vcc3 in the middle of the layout area and distant from power supply ring 14 will be related, for example, as Vcc1>Vcc2>Vcc3. In other words, as the distance from power supply ring 14 increases, the voltage drops due to the resistance component of the power supply wiring, and the power supply voltage Vcc that is supplied to that area decreases.

Though not shown in the drawings, the same applies to ground voltages. As the ground power supply wiring becomes minuter, the distance from the periphery of a chip becomes larger, and, as a result, the ground voltage supplied thereto increases conversely.

If the power supply voltage Vcc drops as described above, the operating speed of a cell or macro that was located in that area will drop, and it is expected that the chip will be unable to operate as an integrated circuit. In other words, cells or function macros are used as components of the integrated circuit based on the premise that a pre-designed operating speed is achieved. Therefore, if the prerequisite operating speed decreases due to a power supply voltage drop resulting from the layout, there is a possibility that the integrated circuit for which a prescribed operation was expected will be unable to operate. A similar phenomenon is also expected when the ground voltage increases.

SUMMARY OF THE INVENTION

An object of the present invention is to provide a layout method and program that can prevent, as much as possible, a chip from being unable to operate as an integrated circuit, even when the power supply wiring becomes minute and the power supply voltage differs according to the on-chip position.

To accomplish the above objective, one aspect of the present invention is that an integrated circuit layout method for placing a plurality of cells within a chip comprises a process for sorting the plurality of cells that are to be laid out in order of their delay times, placing cells having the largest delay times closer to the peripheral area of the chip, and as the cell delay times get smaller, placing the relevant cells closer to the central area of the chip.

A further aspect of the present invention is that an integrated circuit layout method for placing a plurality of function macros within a chip comprises a process for sorting the plurality of function macros that are to be laid out in order of their operating speed margins, placing function macros having the smallest operating speed margins closer to the peripheral area of the chip, and as the function macro operating speed margins get larger, placing the relevant function macros closer to the central area of the chip.

A further aspect of the present invention is that an integrated circuit layout method for placing a plurality of function macros within a chip comprises a process for sorting the plurality of function macros that are to be laid out in order of their operating speed margins, placing function macro having the smallest operating speed margin in the peripheral area of the chip in a first ring configuration, and as the function macro operating speed margins get larger, placing the relevant function macro closer to the central area of the chip in a second ring configuration smaller than the first ring configuration.

By placing cells having larger delay times closer to the peripheral areas of the chip and cells having smaller delay times closer to the central area of the chip, the above invention can prevent the delay time from becoming extremely large causing the integrated circuit to be unable to operate, even if the power supply voltage of the central area decreases or the ground voltage increases thereby resulting in a decrease in the cell operating speeds.

Also, by placing function macros having small operating speed margins closer to the peripheral areas of the chip and function macros having large operating margins closer to the central area of the chip, the above invention can prevent the operating speed margins from becoming extremely tight causing the integrated circuit to be unable to operate, even if the operating speeds of the function macros slow down due to a decrease in the power supply voltage or increase in the ground voltage of the central area.

BRIEF DESCRIPTION OF THE DRAWINGS

FIG. 4 is a diagram showing a cell library configuration example;

FIG. 5 is a diagram showing a macro library configuration example;

DESCRIPTION OF THE PREFERRED EMBODIMENTS

Embodiments of the present invention are described below with reference to the figures. However, the range of protection of the present invention extends to the inventions that appear in the claims and equivalent inventions, and is not limited to the embodiments described below.

Figure 3:
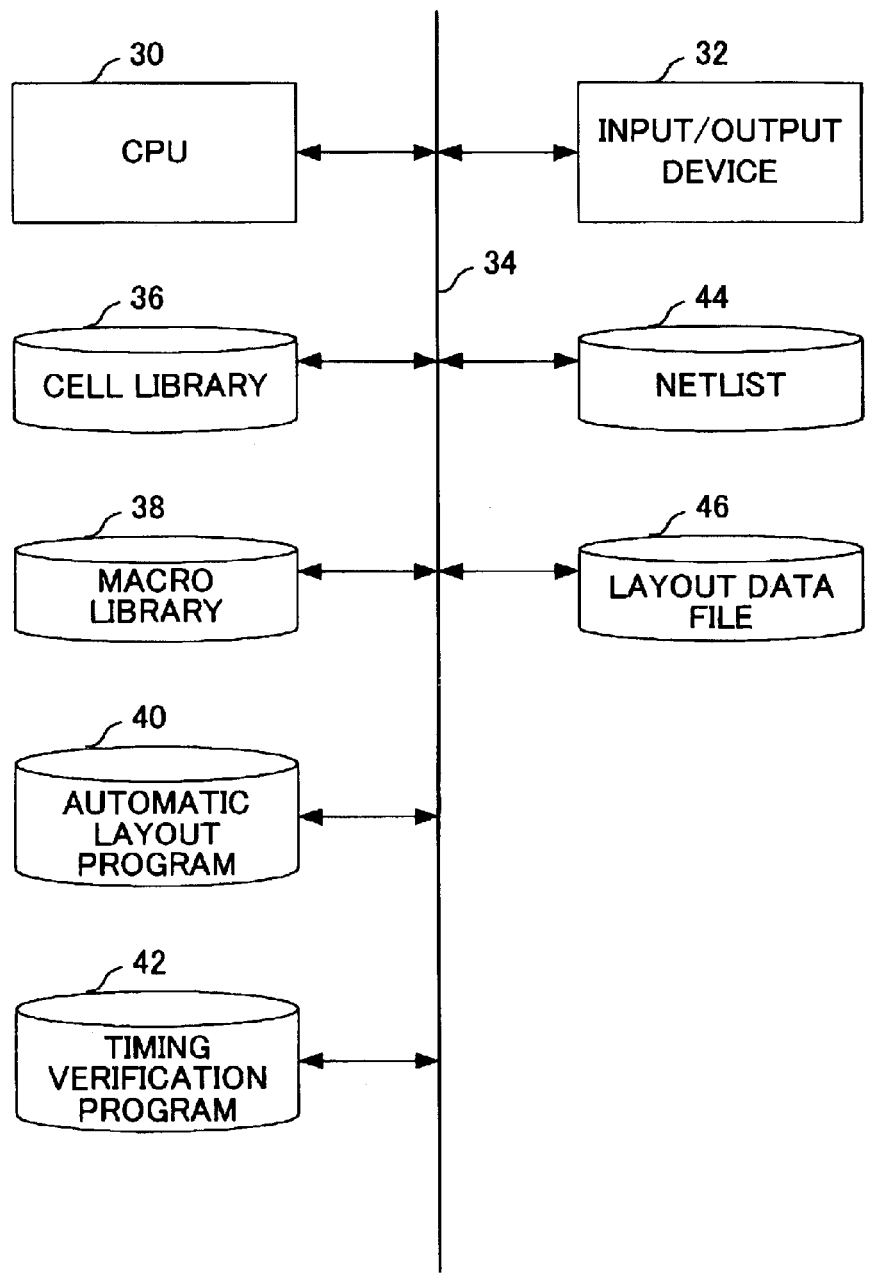
FIG. 3 is a configuration diagram of a layout tool system in an embodiment.

FIG. 3 is a configuration diagram of a layout tool system in an embodiment. This layout tool comprises file devices having cell library 36, macro library 38, automatic layout program 40, and timing verification program 42 established in a general-purpose computer system having CPU 30 and input/output device 32. The programs or databases in these files are connected to CPU 30 or input/output device 32 via internal bus 34.

If netlist 44 of the integrated circuit, which had been logically designed before the layout process, is given, automatic layout program 40 lays out the cells or function macros within that netlist on the chip and then lays out the power supply wiring or connection wiring to generate layout data 46. Also, after layout is completed, timing verification program 42 calculates information such as the connection wiring delay times to verify whether or not the timing of signals within the integrated circuit is implemented appropriately according to those delay time characteristics.

Netlist 44, which is data generated by logical design, has cells or function macros constituting the integrated circuit and data related to their connections. Also, cell library 36 or macro library 38, which are data generated in advance, have data for a plurality of cells and function macros that can be used in integrated circuits.

FIG. 4 is a diagram showing a cell library configuration example. Cells, which comprise a small number of circuit elements such as transistors, are the minimum functional elements used in logical design. For example, cells include NAND gates, NOR gates, flip-flops, and inverters. In the example shown in FIG. 4, NAND1 and NAND2 are established in the cell library as NAND gates and NOR1 and NOR2 as NOR gates so that a plurality of cells having the same functions but different drive capacities or operating speeds are registered. Delay time data td1 to td8 and physical layout data LD1 to LD8 are associated with the various cells in the cell library shown in FIG. 4. Layout data includes specific pattern data of the constituent transistors, resistors, and wiring on the chip.

Therefore, cell library 36 can be referenced to learn the operating speed, that is, the delay time characteristics of each cell.

FIG. 5 is a diagram showing a macro library configuration example. A function macro, which is larger in scale than a cell, is a circuit block having a prescribed function. Therefore, function macros include, for example, processors such as CPUs or DSPs and memory such as DRAM or SRAM. The maximum clock frequencies for which internal operation is guaranteed F1 to F8 and physical layout data MLD1 to MLD8 are associated with the eight types of macros MACRO1 to MACRO8, which are registered in the macro library shown in FIG. 5.

Therefore, the macro library can be referenced to learn the maximum clock frequency at which each function macro can operate.

This maximum clock frequency is closely related to the operating speed margin of a function macro. In other words, the maximum operable clock frequency is a parameter indicating the operating speed of internal circuits within the function macro. When the operating speeds of internal circuits constituting a function macro are fast, the function macro can operate at a fairly high clock frequency. On the other hand, when the operating speeds of internal circuits constituting a function macro are slow, the function macro cannot operate at a very high clock frequency. Therefore, a function macro having a fairly high operable clock frequency range has a large operating speed margin, and a function macro having an operable clock frequency range that is not very high has a small operating speed margin. The operating speed margin is a value related to the difference between the standard operating frequency and the maximum clock frequency.

For example, for a function macro having a high operable clock frequency and large operating speed margin, even if the supplied power supply voltage is somewhat low and the operating speeds of the internal circuits decrease, the operable clock frequency will not be as high as the frequency set in the library but will still be relatively high. On the other hand, for a function macro having a low operable clock frequency and small operating speed margin, if the supplied power supply voltage is low and the operating speeds of the internal circuits decrease, the operable clock frequency in that state will become rather low.

From the above it is clear that even if a function macro having a large operating speed margin is placed in the central area of a chip, it will be able to operate at a certain high clock frequency. Conversely, if a function macro having a small operating margin is placed in the central area of a chip, its operating speed will decrease due to a drop in the power supply voltage and it is not expected to be able to operate even at a certain high clock frequency.

Figure 1:
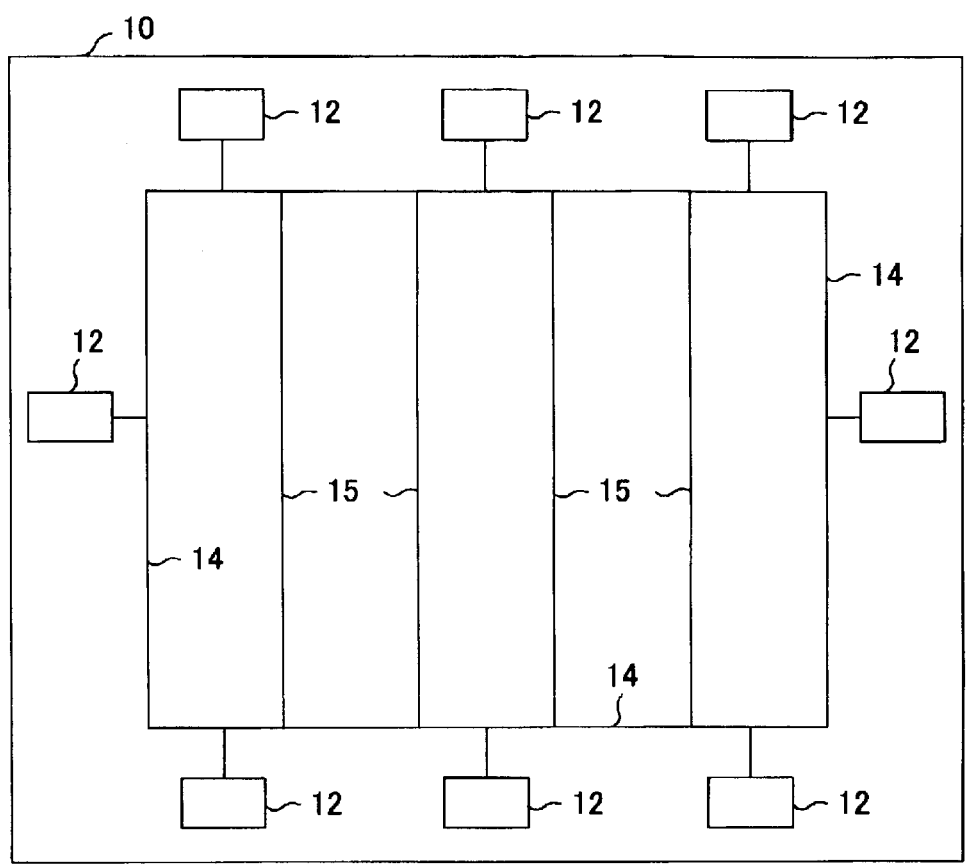
FIG. 1 is a plane view showing an example of on-chip power supply wiring.
Figure 2:
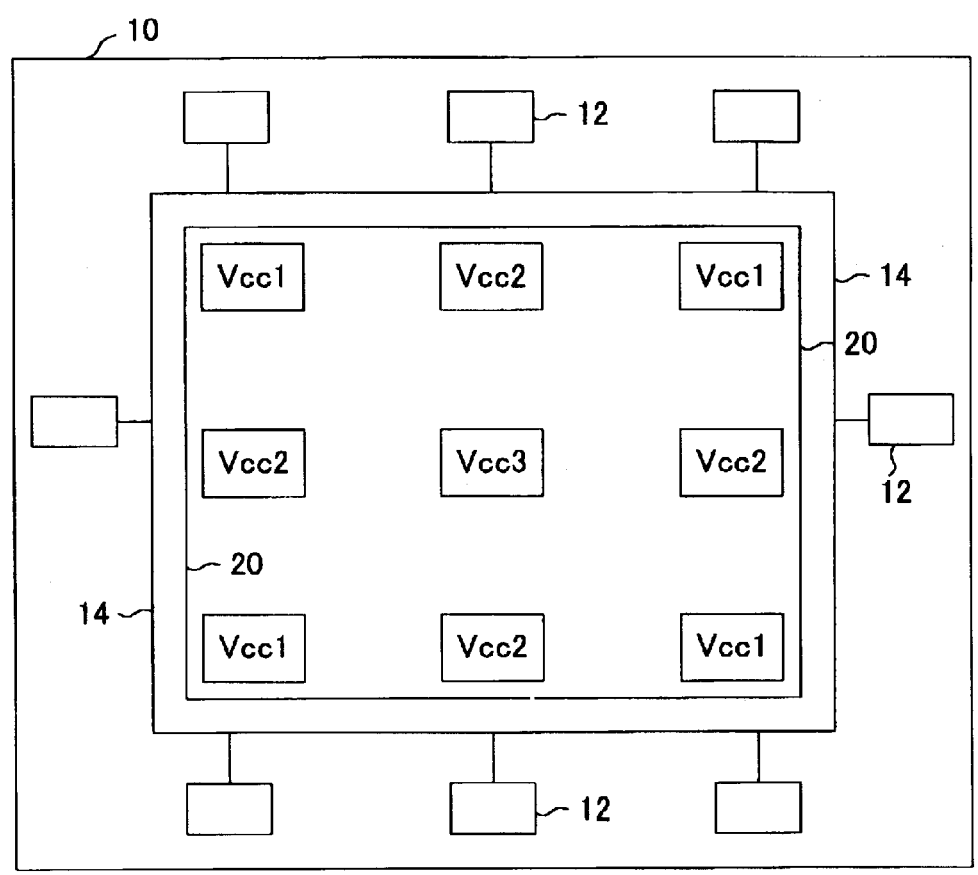
FIG. 2 is a diagram showing a distribution of the power supply voltage that is expected in the future.
Figure 6:
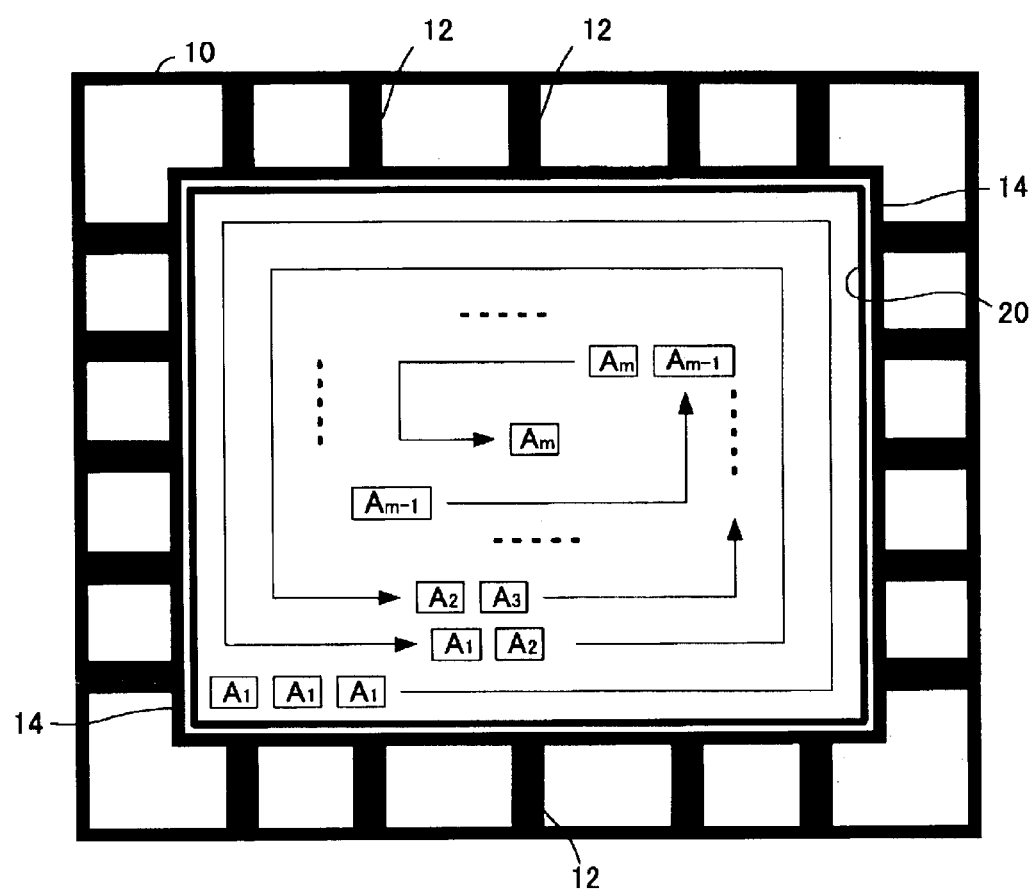
FIG. 6 is a diagram showing a cell layout method in a first embodiment.
Figure 7:
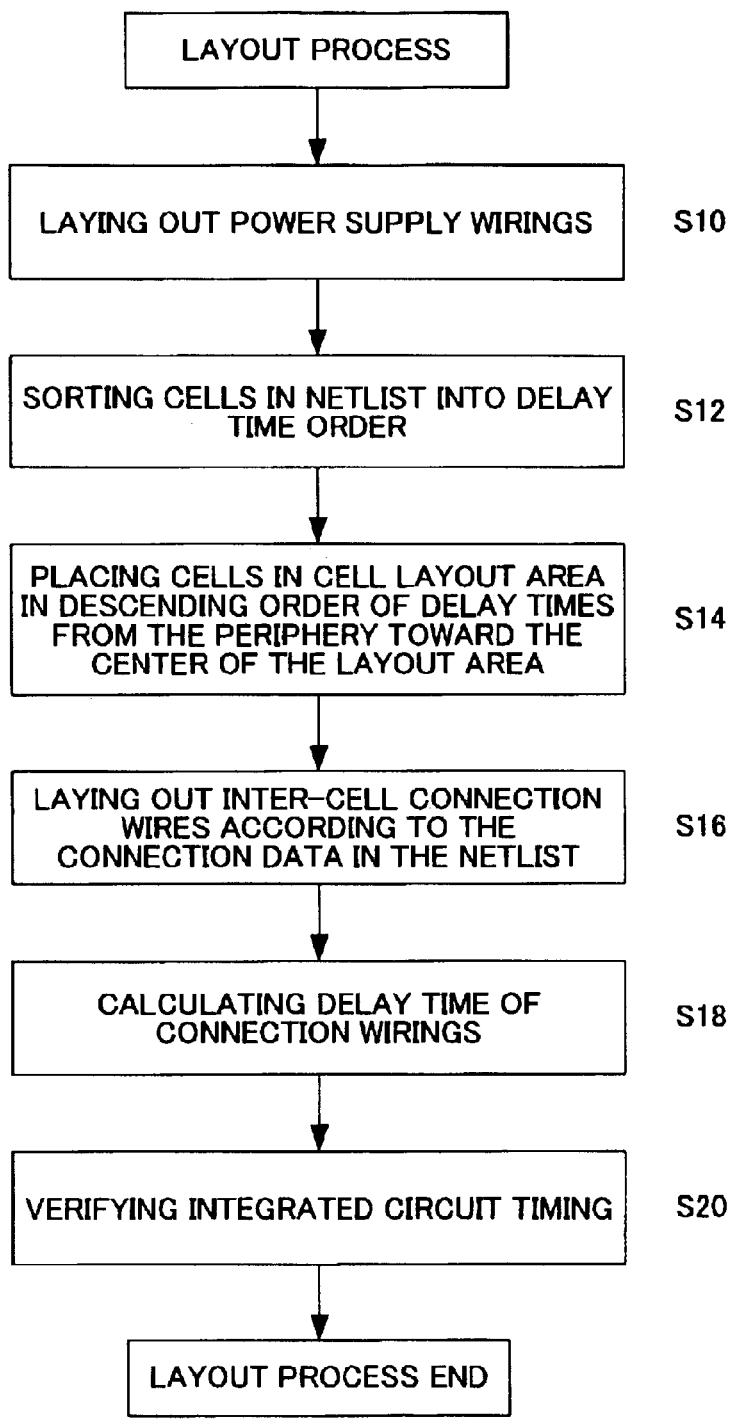
FIG. 7 is a flowchart of a cell layout method in a first embodiment.

FIG. 6 is a diagram showing a cell layout method in a first embodiment. Also, FIG. 7 is a flowchart of a cell layout method in a first embodiment. Like in FIGS. 1 and 2, power supply ring 14 circumnavigates the periphery of chip 10 and is connected to a plurality of power supply pins 12 established on the periphery of chip 10. The interior of power supply ring 14 is layout area 20. Like in FIG. 2, the internal power supply wirings are omitted.

In a first embodiment, when cells A, which are placed in the layout area, are arranged in descending order of delay times, the cell having the nth largest delay time is called An (n ranges from 1 to m). As shown in FIG. 6, cells A1 having the largest delay time are placed circumnavigating the periphery of the chip in layout area 20 as indicated by the arrow, and when all of a plurality of cells A1 having the largest delay time have been placed, cells A2 having the next largest delay time are placed further closer to the interior. In the example shown in FIG. 6, cells A2 are placed in the second circumnavigation from the periphery of the chip. Cells are arranged in this way up to cells Am having the smallest delay time. Cells Am having the smallest delay time are placed in the central portion of layout area 20. In other words, low-speed cells are placed closer to the periphery of the chip and high-speed cells are placed closer to the center.

As cells approach the central area of the chip, the power supply voltage drop increases and the power supply voltages applied to the cells decrease accordingly, causing the operating speeds of the cells to decrease. However, by arranging the cells as described above, since cells having smaller delay times are laid out closer to the central area of the chip, even if the operating speeds of cells in the central area decrease due to a voltage drop of the power supply wiring, the delay times will not increase that much, and the effect on the operation of the entire integrated circuit can be minimized.

This kind of layout method for a plurality of cells is more effective when the elements to be laid out comprise only a plurality of cells. This is because function macros generally have large-scale configurations, and when function macros are formed in the layout area, it may be difficult to place a plurality of cells arranged according to delay times in order from the periphery to the center of the chip. However, as described later, the above cell layout method may be able to be executed, depending on the function macro area.

A specific layout process is described next according to the flowchart in FIG. 7. In this example, netlist 44 contains a plurality of cells and their connection data. When automatic layout program 40 is executed by specifying the netlist, first, the power supply wirings within the chip are laid out (S10). As a result, power supply ring 14 and internal power supply wires 15 are laid out. Next, the layout program sorts a plurality of cells within the netlist into delay time order (S12). The standard delay time of each cell can be known by referencing cell library 36.

Next, the layout program places cells into cell layout area 20 of the chip in descending order of delay times from the periphery towards the center of the layout area (S14). The placement order may proceed from the periphery towards the center in descending order of delay times or from the center towards the periphery in ascending order of delay times. Also, cells may be arranged in a spiral shape as shown in FIG. 6 or in a torus (donut) shape. In this step S14, the connection wiring area is taken into consideration and the inter-cell distance is maintained at a prescribed distance.

Next, the layout program lays out the inter-cell connection wires according to the connection data in the netlist (S16). As a result, layout data file 46 is generated.

When the connection wiring layout is completed, the timing verification program references the layout data to calculate the connection wiring delay time (S18) and uses that calculated delay time to verify the integrated circuit timing (S20). The delay time calculation step and timing verification step are implemented by using the conventional timing verification program. Normally, if the timing verification test cannot be passed, the steps beginning with cell layout step S12 are repeated again.

Figure 8:
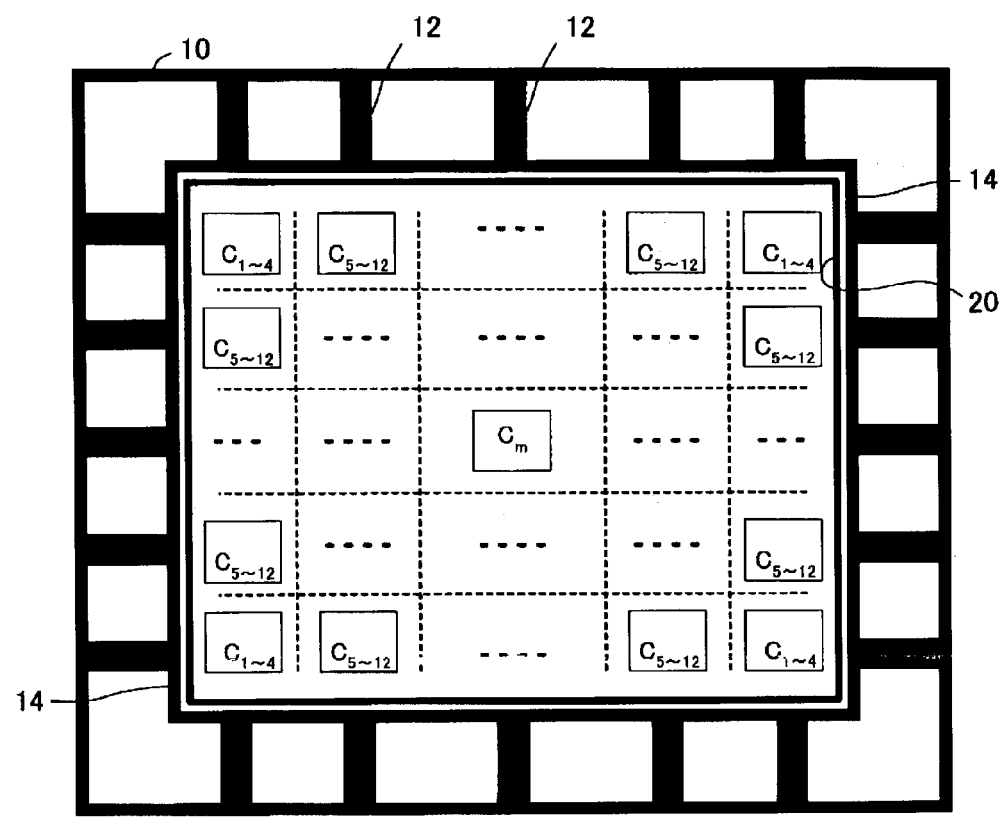
FIG. 8 is a diagram showing a function macro layout method in a second embodiment.
Figure 9:
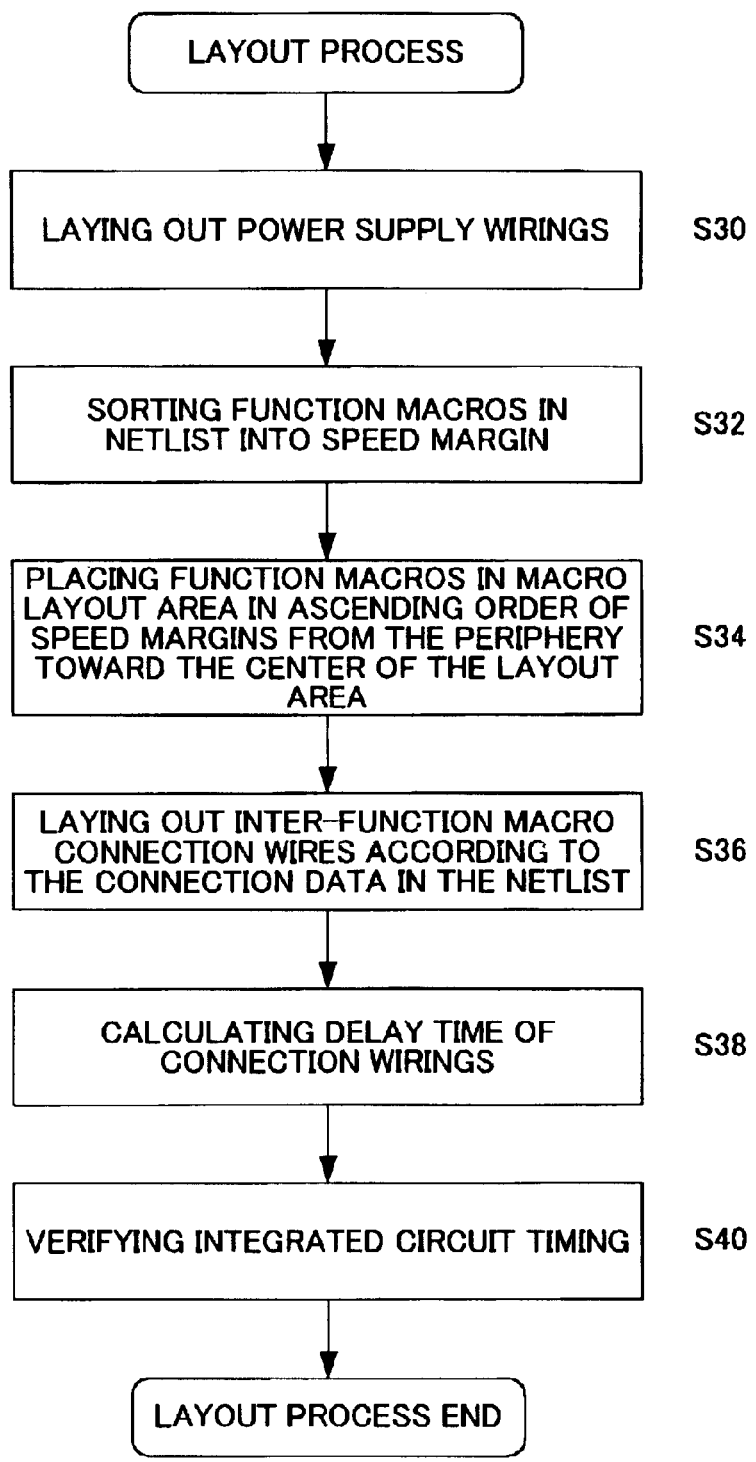
FIG. 9 is a flowchart of a function macro layout method in a second embodiment.

FIG. 8 is a diagram showing a function macro layout method in a second embodiment. Also, FIG. 9 is a flowchart of a function macro layout method in a second embodiment. In this case also, power supply ring 14 circumnavigates the periphery of chip 10 and is connected to a plurality of power supply pins 12 established on the periphery of chip 10. The interior of power supply ring 14 is layout area 20.

In a second embodiment, when function macros C, which are placed in the layout area, are arranged in ascending order of operating speed margins, the function macro having the nth smallest operating speed margin is called Cn (n ranges from 1 to m). As shown in FIG. 8, function macro C1, which has the smallest operating speed margin, to function macro C4, which has the 4th smallest operating speed margin, are placed in the four corners of layout area 20. Then, function macro C5, which has the 5th smallest operating speed margin, to function macro C12, which has the 12th smallest operating speed margin, are placed in the nearest surrounding areas of the four corners of layout area 20. Thereafter, function macros that were grouped in order of operating speed margins are placed in a similar manner from the periphery towards the center of layout area 20. Here, function macro Cm having the largest operating speed margin is placed at the center of layout area 20.

By arranging function macros in this way, function macros having small operating speed margins are placed in peripheral areas where the power supply voltage drop is small, and function macros having larger operating margins are placed closer to the central area where the power supply voltage drop is large. Therefore, even if the operating speeds of function macros in the central area decrease due to a drop in the power supply voltage, a higher operable clock frequency of the entire integrated circuit can be ensured, thereby preventing the integrated circuit from being unable to operate due to a decrease in the power supply voltage.

The above layout method of a second embodiment is an effective method when the sizes of the function macros that are placed in the layout area are relatively small. Also, this method can be applied even when the netlist contains a plurality of cells in addition to a plurality of function macros. In other words, the methods shown in FIGS. 6 and 8 can be used at the same time.

A layout method is described next according to the flowchart in FIG. 9. Like in the first embodiment, when the netlist is specified, automatic layout program 40 lays out the power supply wirings on the chip (S30). As a result, a power supply ring and internal power supply wires are formed. Next, the layout program sorts a plurality of function macros within the netlist into ascending order of their operating speed margins (S32). This sorting is performed by referencing macro library 38 to find the operating speed margin of each function macro.

Next, the automatic layout program places function macros into layout area 20, in which the macros within the chip are placed, in ascending order of operating speed margins from the periphery towards the center of the layout area (S34). A specific example of this arrangement is given in the explanation of FIG. 8. Also, function macros having large operating speed margins may be placed first in the central portion and function macros having small operating speed margins may then be placed in the peripheral portion, or the function macros may be placed in the opposite order.

Next, when the layout of all function macros is completed, the automatic layout program lays out the inter-function macro connection wires based on the netlist (S36). As a result, layout data file 46 is generated.

Next, timing verification program 42 calculates the connection wiring delay time (S38) to verify the integrated circuit timing (S40).

Figure 10:
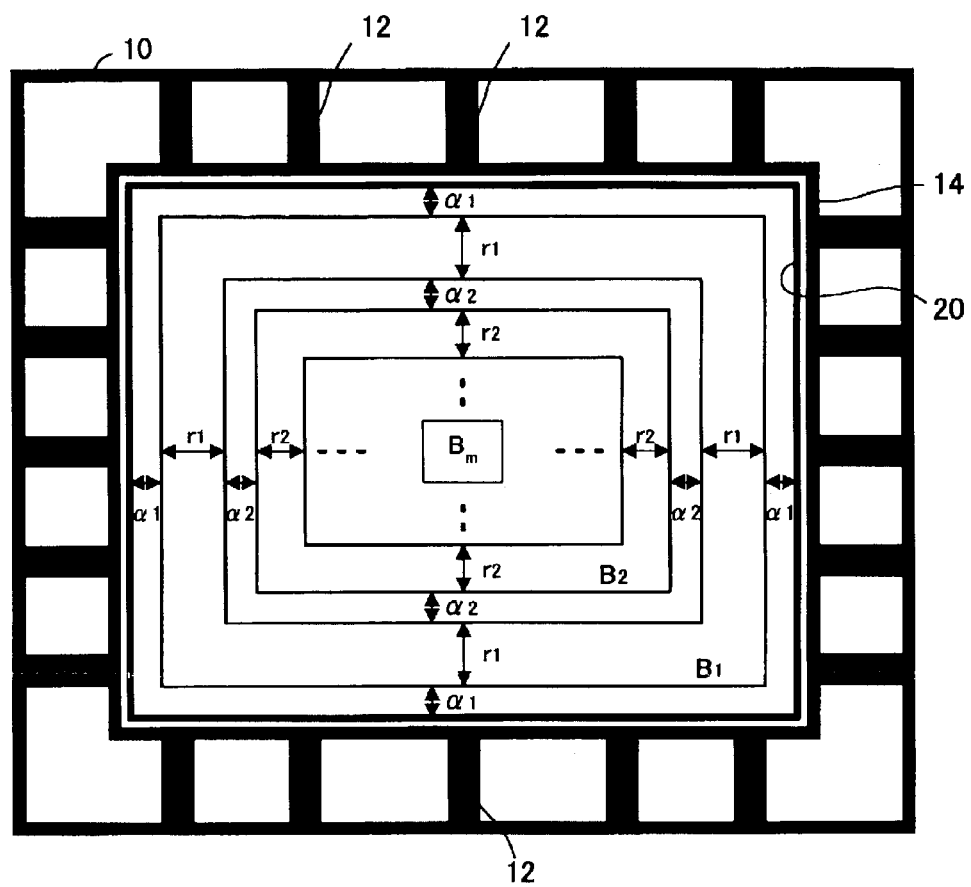
FIG. 10 is a diagram showing a function macro layout method in a third embodiment.
Figure 11:
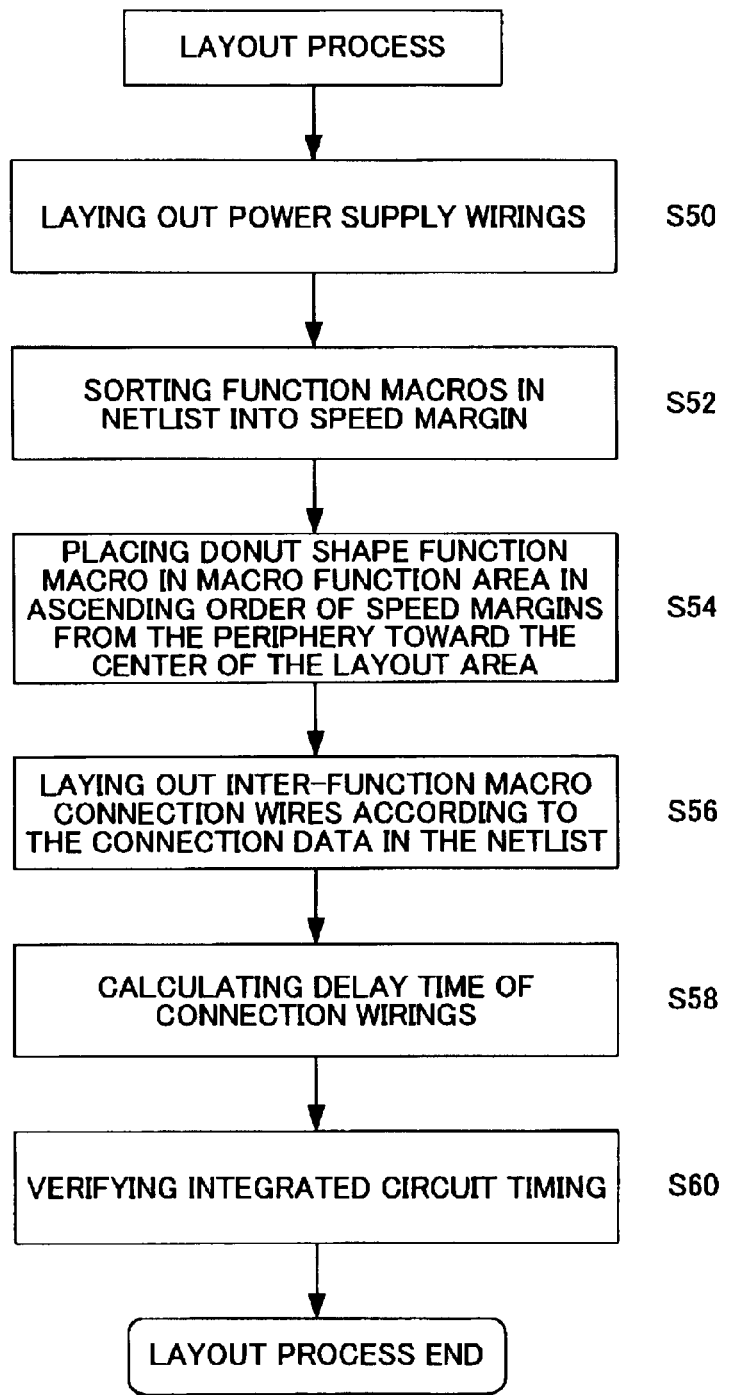
FIG. 11 is a flowchart of a function macro layout method in a third embodiment.

FIG. 10 is a diagram showing a function macro layout method in a third embodiment. Also, FIG. 11 is a flowchart of a function macro layout method in a third embodiment. In this case also, power supply ring 14 circumnavigates the periphery of chip 10 and is connected to a plurality of power supply pins 12 established on the periphery of chip 10. The interior of power supply ring 14 is layout area 20.

A third embodiment is applied to the layout of relatively large-scale function macros. Its characteristic feature is that a function macro is assumed to have a torus (donut) shape or ring shape. A torus (donut) shape, which is a band having a prescribed width r, has an outer periphery and an inner periphery. Like with the second embodiment, a plurality of function macros that are to be laid out are arranged in ascending order of operating speed margins, and the nth function macro is indicated by Bn. Function macro B1, which has the smallest operating speed margin, is laid out with a ring shape or torus (donut) shape having width r1 at the outermost part of layout area 20. At this time, wiring area α1 is allocated in advance on the outside of function macro B1. Function macro B2, which has the next smallest operating speed margin, is placed with a ring shape or torus (donut) shape having width r2 inside function macro B1, with wiring area α2 for wire connections with function macro B1 interposed therebetween. Similarly, ring-shaped or torus (donut)-shaped function macros are placed closer to the center of the layout area in ascending order of their operating speed margins.

The abovementioned macro width r should be made uniform on four sides. Similarly, the wiring area a between function macros should be made uniform on four sides. By doing so, each function macro is maintained at a uniform distance from the chip periphery within the layout area. As a result, the following rule is implemented. Function macros having small operating margins are placed closer to the periphery of the chip and function macros having large operating margins are placed closer to the center of the chip.

In an example of a third embodiment, the physical layout patterns of function macros are ring shapes or torus (donut) shapes. Moreover, the positions at which they are placed will differ depending on the combination of a plurality of function macros contained in the integrated circuit, and they may have to be given large torus (donut) shapes (with narrow widths) or small torus (donut) shapes (with wide widths). Therefore, a plurality of types of layout data should be registered for each function macro in macro library 38.

A layout process is described next according to the flowchart in FIG. 11. In this case also, first, the automatic layout program lays out the power supply wiring (S50). Next, the layout program sorts a plurality of function macros within the netlist into ascending order of their operating speed margins (S52). Then, the layout program places ring-shaped or torus (donut)-shaped function macros into layout area 20 within the chip in ascending order of operating speed margins from the periphery towards the center of the layout area (S54). Next, the layout program lays out the inter-macro connection wires according to the netlist (S56). As a result, the layout data file is generated.

Then, the timing verification program calculates the connection wiring delay time (S58) and uses that delay time to verify the integrated circuit timing (S60). If the timing verification test is not passed, the steps beginning with the function macro layout step S52 are repeated again.

Figure 12:
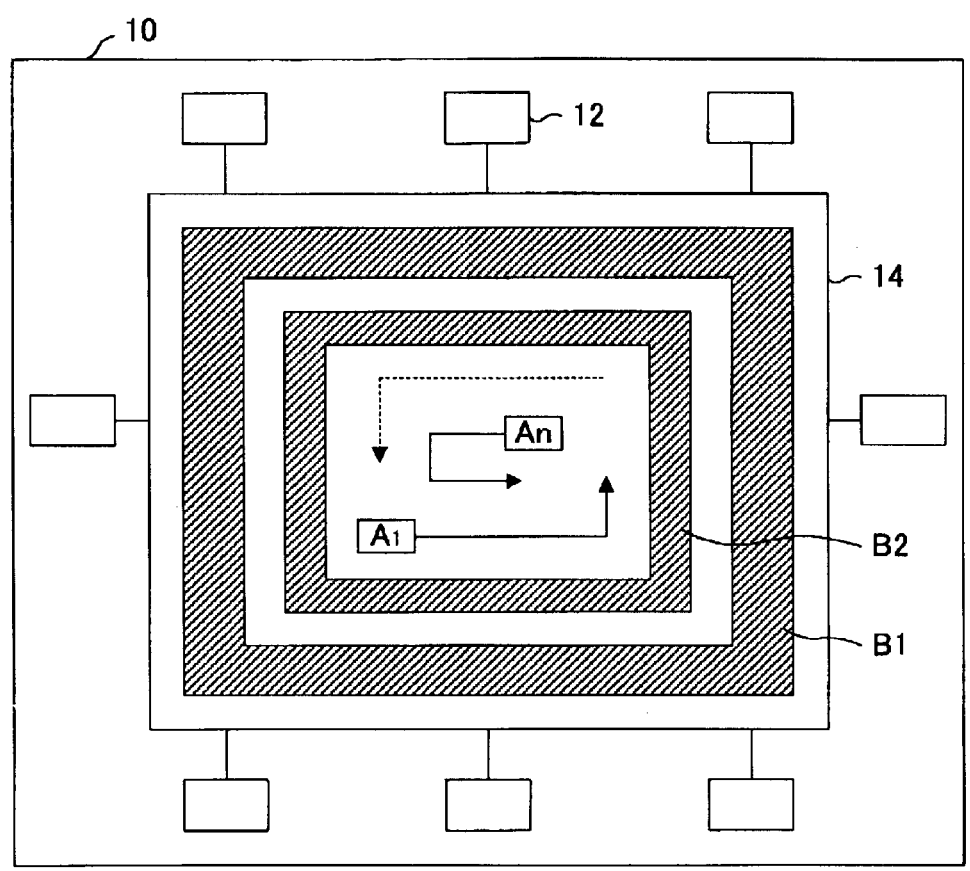
FIG. 12 is a diagram showing a layout example in which first and third embodiments are combined.

FIG. 12 is a diagram showing a layout example in which first and third embodiments are combined. Two torus (donut)-shaped function macros B1 and B2, which comply with the third embodiment, are placed near the periphery in the layout area inside power supply ring 14, and a plurality of cells A1 to An, which comply with the first embodiment, are placed inside the function macros. This is an example in which relatively large-scale function macros and a plurality of cells are included in the netlist.

Figure 13:
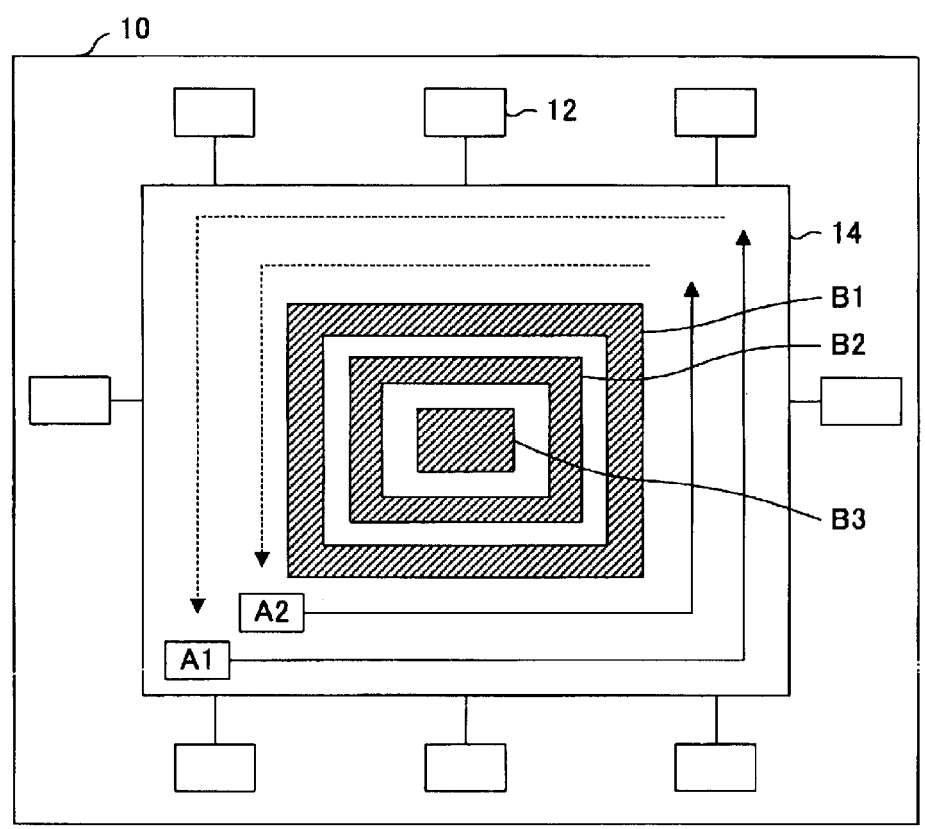
FIG. 13 is a diagram showing a layout example in which first and third embodiments are combined.

FIG. 13 is also a diagram showing a layout example in which first and third embodiments are combined. However, in FIG. 13, a plurality of cells A1 and A2, which comply with the first embodiment, are placed along the paths indicated by the arrows, and a plurality of torus (donut)-shaped function macros B1, B2, and B3, which comply with the third embodiment, are placed inside the paths where the cells were placed. This is an example in which a relatively large number of cells and relatively large-scale function macros are included in the netlist.

Figure 14:
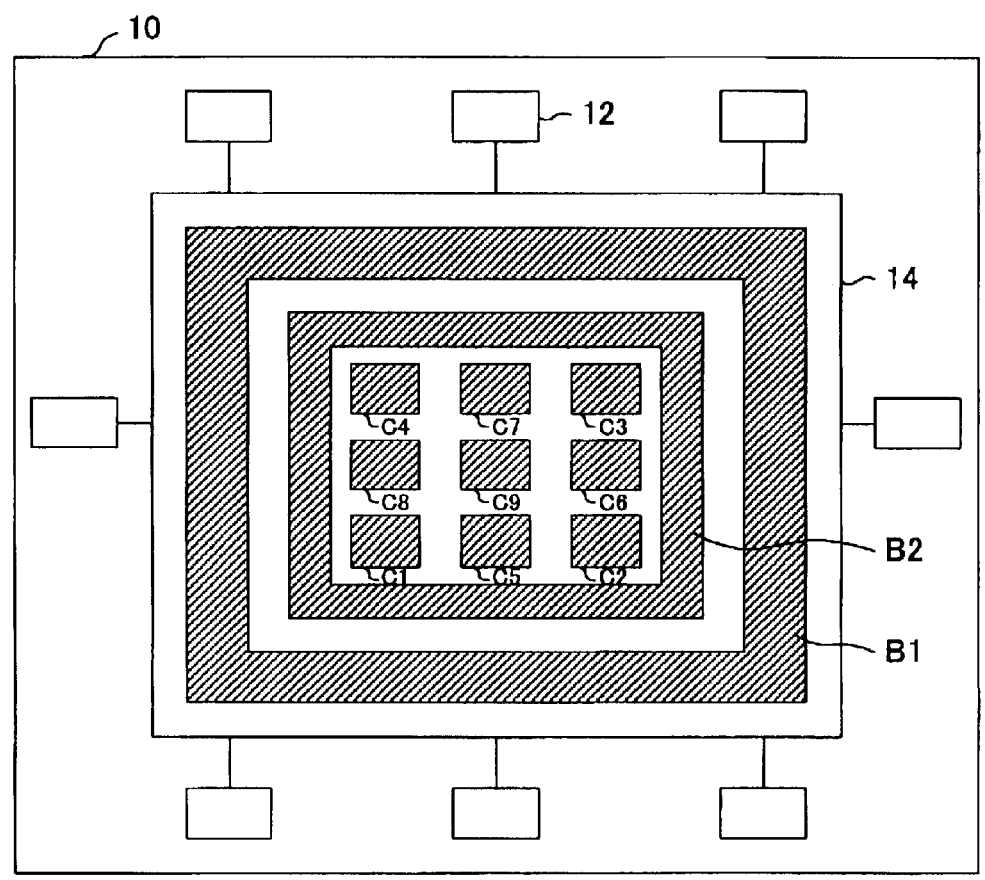
FIG. 14 is a diagram showing a layout example in which second and third embodiments are combined.

FIG. 14 is a diagram showing a layout example in which second and third embodiments are combined. Two torus (donut)-shaped function macros B1 and B2, which comply with the third embodiment, are placed near the periphery in the layout area, and a plurality of function macros C1 to C9, which comply with the second embodiment, are placed inside these function macros. This is an example in which relatively large-scale function macros and small-scale function macros are included in the netlist.

A layout in which first and second embodiments are combined can also be used. For example, a plurality of cells that comply with the first embodiment can be placed near the periphery of the layout area, and a plurality of function macros that comply with the second embodiment can be placed near the center. The first and second embodiments can also be combined in the reverse manner.

Furthermore, in the abovementioned examples involving the first to third embodiments, all of the cells or function macros that are placed in the layout area may be placed according to the rules, or a small number of exceptional cells or functions macros may be excluded and the remaining large number of cells or function macros may be placed according to the rules.

According to the present invention, it is possible to to prevent an integrated circuit from being unable to operate because of a drop in power supply voltage in the central portion of a chip due to an increase in the resistance component when the power supply wiring becomes minuter and a decrease in the operating speed of cells or function macros that are placed therein.

What is claimed is:

1. An integrated circuit layout method for placing a plurality of cells within a chip, said integrated circuit layout method comprising:

a process for sorting a plurality of cells that are to be laid out in order of cell delay times thereof; and a process for placing cells having the largest cell delay times closer to a peripheral area of said chip, and as the cell delay times get smaller, placing the corresponding cells closer to a central area of said chip.

2. The integrated circuit layout method according to claim 1, wherein said sorting process detects a first cell group having a first cell delay time and a second cell group having a second cell delay time smaller than said first cell delay time, and said placement process places a plurality of cells of said first cell group closer to the peripheral area of said chip and places a plurality of cells of said second cell group closer to the central area of said chip.

3. An integrated circuit layout program for placing a plurality of cells within a chip, said integrated circuit layout program causing a computer to execute:

a procedure for sorting a plurality of cells that are to be laid out in order of cell delay times thereof; and a procedure for placing cells having the largest cell delay times closer to a peripheral area of said chip, and as the cell delay times get smaller, placing the corresponding cells closer to a central area of said chip.

4. An integrated circuit layout method for placing a plurality of function macros within a chip, said integrate circuit layout method comprising:

a process for sorting a plurality of function macros that are to be laid out in order of function macro operating speed margins thereof; and a process for placing function macros having the smallest function macro operating speed margins closer to a peripheral area of said chip, and as the function macro operating speed margins get larger, placing the corresponding function macros closer to a central area of said chip.

5. The integrated circuit layout method according to claim 4, wherein said placement procedure places function macros having the smallest function macro operating speed margins at corners of the periphery of said chip.

6. The integrated circuit layout method according to claim 4, wherein said function macro operating speed margins are larger for higher maximum clock frequencies at which said corresponding function macros can operate.

7. An integrated circuit layout program for placing a plurality of function macros within a chip, said integrated circuit layout program causing a computer to execute:

a procedure for sorting a plurality of function macros that are to be laid out in order of function macro operating speed margins thereof; and a procedure for placing function macros having the smallest function macro operating speed margins closer to a peripheral area of said chip, and as the function macro operating speed margins get larger, placing the corresponding function macros closer to a central area of said chip.

8. An integrated circuit layout method for placing a plurality of function macros within a chip, said integrated circuit layout method comprising:

a process for sorting a plurality of function macros that are to be laid out in order of function macro operating speed margins thereof; and a process for placing function macros having the smallest function macro operating speed margins closer to a peripheral area of said chip in a first ring configuration, and as the function macro operating speed margins get larger, placing the corresponding function macros closer to a central area of said chip in a second ring configuration smaller than the first ring configuration.

9. The integrated circuit layout method according to claim 8, wherein said first and second ring configurations have a prescribed width, and have outer and inner peripheries, and a wiring area with a prescribed width is interposed between neighboring ring-configuration function macros.

10. The integrated circuit layout method according to claim 8, wherein function macro operating speed margins of said function macros are larger for higher maximum clock frequencies at which said corresponding function macros can operate.

11. An integrated circuit layout program for placing a plurality of function macros within a chip, said integrated circuit layout program causing a computer to execute:

a procedure for sorting a plurality of function macros that are to be laid out in order of function macro operating speed margins thereof; and a procedure for placing function macros having the smallest function macro operating speed margins closer to a peripheral area of said chip in a first ring configuration, and as the function macro operating speed margins get larger, placing the corresponding function macros closer to a central area of said chip in a second ring configuration smaller than the first ring configuration.

* * * * *